(12) United States Patent
Wolkow et al.

(10) Patent No.: US 12,174,218 B2
(45) Date of Patent: Dec. 24, 2024

(54) ATOMIC NANO-POSITIONING DEVICE

(71) Applicants: National Research Council of Canada, Ottawa (CA); The Governors of the University of Alberta, Edmonton (CA)

(72) Inventors: Robert A. Wolkow, Edmonton (CA); Jason Pitters, Ottawa (CA); Mark Salomons, Ottawa (CA)

(73) Assignees: National Research Council of Canada, Ottawa (CA); The Governors of the University of Alberta, Edmonton (CA)

( * ) Notice: Subject to any disclaimer, the term of this patent is extended or adjusted under 35 U.S.C. 154(b) by 391 days.

(21) Appl. No.: 17/638,937

(22) PCT Filed: Aug. 31, 2020

(86) PCT No.: PCT/CA2020/051191
§ 371 (c)(1),
(2) Date: Feb. 28, 2022

(87) PCT Pub. No.: WO2021/035366
PCT Pub. Date: Mar. 4, 2021

(65) Prior Publication Data
US 2022/0299544 A1    Sep. 22, 2022

Related U.S. Application Data

(60) Provisional application No. 62/893,338, filed on Aug. 29, 2019.

(51) Int. Cl.
*G01Q 10/02* (2010.01)
*G01Q 10/04* (2010.01)
*H02N 2/02* (2006.01)

(52) U.S. Cl.
CPC .............. *G01Q 10/02* (2013.01); *G01Q 10/04* (2013.01); *H02N 2/025* (2013.01)

(58) Field of Classification Search
CPC ......... G01Q 10/02; G01Q 10/04; H02N 2/025
See application file for complete search history.

(56) References Cited

U.S. PATENT DOCUMENTS 5,371,365 A     12/1994   Watanabe et al.
7,361,893 B1 *   4/2008   Li ........................... G01Q 60/16
                                                            250/306
(Continued)

FOREIGN PATENT DOCUMENTS

CA    2469041 A1    6/2003
CA    2991920 A1   10/2016
(Continued)

OTHER PUBLICATIONS

Int'l Search Report for PCT/CA2020/051191, dated Nov. 13, 2020.
(Continued)

*Primary Examiner* — Nicole M Ippolito
(74) *Attorney, Agent, or Firm* — MaxGoLaw PLLC

(57) ABSTRACT

A nano-positioning system for fine and coarse nano-positioning including at least one actuator, wherein the at least one actuator includes a high Curie temperature material and wherein the nano-positioning system is configured to apply a voltage to the at least one actuator to generate fine and/or coarse motion by the at least one actuator. The nano-positioning system being a stand-alone system, a scanning probe microscope, or an attachment to an existing microscope configured to perform a method of creepless nano-positioning that includes positioning a probe relative to a first area of a substrate using coarse stepping and interacting with the first area of the substrate using fine motion after less than 60 seconds of the positioning the probe. The movement of the scanning probe microscope is actuated by a high Curie (Continued)

temperature piezoelectric material that limits and/or eliminates creep, hysteresis and aging.

21 Claims, 6 Drawing Sheets

(56) References Cited

U.S. PATENT DOCUMENTS

| | | | |
|---|---|---|---|
| 2008/0117258 A1* | 5/2008 | Silverbrook | B41J 2/14427 347/47 |
| 2010/0013354 A1 | 1/2010 | Marth et al. | |
| 2010/0115671 A1 | 5/2010 | Pryadkin et al. | |
| 2014/0152151 A1 | 6/2014 | Potemkin et al. | |
| 2015/0295162 A1* | 10/2015 | Yamazaki | C04B 35/495 264/618 |

FOREIGN PATENT DOCUMENTS

| | | |
|---|---|---|
| JP | H02271204 A | 11/1990 |
| JP | H05280922 A | 10/1993 |
| JP | H06258016 | 9/1994 |
| JP | 2006266781 | 10/2006 |
| JP | 2010500675 A | 1/2010 |
| WO | 1993019494 A1 | 9/1993 |

OTHER PUBLICATIONS

Non-hysteresis and perfect linear piezoelectric performance of a multilayered lithium niobate actuator, Department of Human Environmental Studies, Graduate School of Frontier Science, The University of Tokyo, ScienceDirect: Sensors and Actuators A 135 (pp. 782-786) (Kawamata et al.), Oct. 11, 2006 (Oct. 11, 2006).
Hysteresis-free high-temperature precise bimorph actuators produced by direct bonding of lithium niobate wafers, Applied Physics Letters, vol. 106, Issue 5, 106, 053116 (Shur, et al.), Feb. 5, 2015 (Feb. 5, 2015).
Supplementary European Search Report issued in corresponding European Patent Appln. No. 20858948, dated Aug. 2, 2023.
Heider, et al., "Distortion-free, calibrated LiNbO3 piezoscanner for probe microscopes with atomic resolution", Review of Sci. Instr. 64, 3534 (1993).
Matsunami, et al., "Multilayered LiNbo3 actuator for XY-stage using a shear piezoelectric effect", Sensors and Actuators A 144 (2008), pp. 337-340.
Zhou, et al., "Development of a Novel Parasitic-Type Piezoelectric Actuator", IEEE/ASME Transactions on Mechatronics, vol. 22, No. 1, Feb. 2017, pp. 541-550.
Zwanenburg, et al., "Silicon quantum electronics", Reviews of Modern Physics, vol. 85, No. 3, Jul.-Sep. 2013, pp. 961-1019.
Prati, et al., "Atomic scale devices: advancements and directions", Digest—Int'l Electron Devices Meeting, IEDM, Feb. 2015: 1.2.1{1.2.4, 2015.
Khajetoorians, et al., "Realizing All-Spin-Based Logic Operations Atom by Atom", Science, vol. 332, May 27, 2011, pp. 1062-1064.
Fuechsle, et al., "A single-atom transistor", Nature Nanotechnology, vol. 7, Apr. 2012, pp. 242-246.
Huff, et al., "Atomic White-Out: Enabling Atomic Circuitry through Mechanically Induced Bonding of Single Hydrogen Atoms to a Silicon Surface", ACS Nano 2017, vol. 11, pp. 8636-8642.
Kalff, et al., "A kilobyte rewritable atomic memory", Nature Nanotechnology, vol. 11, Nov. 2016, pp. 926-929.
Imre, et al., "Majority Logic Gate for Magnetic Quantum-Dot Cellular Automata", Science, vol. 311, Jan. 13, 2006, pp. 205-208.
Sotthewes, et al., "Research Update: Molecular electronics: The single-molecule switch and transistor", APL Materials 2, 010701 (2014), pp. 1-11.
Pavilcek, et al., "Tip-induced passivation of dangling bonds on hydrogenated Si(100)-2x1", Appl. Phys. Lett. 111, 053104 (2017), pp. 1-4.
Achal, et al., "Lithography for robust and editable atomic-scale silicon devices and memories", Nature Communications, (2018)9:2778, pp. 1-8.
Haider, et al., "Controlled Coupling and Occupation of Silicon Atomic Quantum Dots at Room Termperature", Physical Review Letters, PRL 102, 046805 (2009), pp. 1-4.
Lopinski, et al., "Self-directed growth of molecular nanostructures on silicon", Nature, vol. 406, Jul. 6, 2000, pp. 48-51.
Tong, et al., "A Self-Directed Growth Process for Creating Covalently Bonded Molecular Assemblies on the H—Si (100)-3x1 Surface", Nano Letters, vol. 4, No. 5, 2004, pp. 979-983.
Sieval, et al., "Monolayers of 1-Alkynes on the H-Terminated Si(100) Surface", Langmuir, vol. 16, No. 26, 2000, pp. 10359-10368.
Lyding, et al., "Nanoscale patterning and selective chemistry of silicon surfaces by ultrahigh-vacuum scanning tunneling microscopy", Nanotechnology 7 (1996), pp. 128-133.
Schofield, et al., "Atomically Precise Placement of Single Dopants in Si", Physical Review Letters, vol. 91, No. 13, Sep. 2003, pp. 1-4.
Wolkow, "A Step Toward Making and Wiring Up Molecular-Scale Devices", Jpn. J. Appl. Phys., vol. 40, pp. 4378-4380, Jun. 2001.
Tucker, et al., "Prospects for Atomically Ordered Device Structures Based on STM Lithography", Solid State Elec., vol. 42, No. 7-8, 1998, pp. 1061-1067.
Randall, et al., "Automated Scanning Tunneling Microscope image analysis of Si (100):H 2x1 surfaces", Microelectronic Eng. 98 (2012), pp. 214-217.
Modarres, et al., "Neural Network for Nanoscience Scanning Electron Microscope Image Recognition", Scientific Reports, vol. 7:13282, pp. 1-12.
Ziatdinov, et al., "Learning surface molecular structures via machine vision", Computational Materials (2017) 1, pp. 1-9.
Shur, et al., "Hysteresis-free high-temperature precise biomorph actuators produced by direct bonding of lithium niobate waters", Applied Physics Letters, 106, 053116 (2015), pp. 1-4.
Islam, et al., "Note: Position self-sensing for piezoelectric actuators in the presence of creep and rate-dependent hysteresis", Rev. Sci. Instrum. 83, 116101 (2012), pp. 1-3.
Kawamata, et al., "Non-hysteresis and perfect linear piezoelectric performance of a multilayered lithium niobate actuator", Sensors and Actuators A 135 (2007), pp. 782-786.
Office Action issued in corresponding Japanese Patent Appln. No. 2022-511188, dated Jun. 4, 2024.
Xing, et al., "Two new high Curie temperature piezoelectric ceramics", Materials Letters vol. 160, 2015, pp. 38-40.

* cited by examiner

ATOMIC NANO-POSITIONING DEVICE

CROSS-REFERENCE TO RELATED APPLICATION

This application claims priority of U.S. Provisional Patent Application Ser. No. 62/893,338 filed Aug. 29, 2019, which is incorporated herein by reference.

FIELD OF THE INVENTION

The present invention is directed the field of nano-positioning systems and more particularly to the field of piezoelectric actuators, including piezoelectric nano-positioning systems for scanning probe microscopy.

BACKGROUND

With the miniaturization of complementary metal-oxide-semiconductor (CMOS) technology approaching its fundamental limit, alternatives built at an atomic level have been developed such as those disclosed in U.S. patent application Ser. No. 16/318,262.[1,2,3]

Scanning probe microscopes (SPMs) are a family of tools used to make images of nanoscale surfaces and structures, including atoms. They use a physical probe to scan back and forth over the surface of a sample. During this scanning process, a computer gathers data that is used to generate an image of the surface. There are several types of SPMs. Some examples include, atomic force microscopes, magnetic force microscopes, and scanning tunneling microscopes. Atomic force microscopes (AFMs) measure the forces between the cantilever tip and the sample. Magnetic force microscopes (MFMs) measure magnetic forces. Scanning tunneling microscopes (STMs) measure the tunneling current flowing between the tip and the sample.

An SPM has a probe tip that can be as sharp as a single atom. The tip is moved precisely and accurately back and forth across the surface, even atom by atom. When the tip is near the sample surface, SPMs can measure tip-surface interactions caused by many kinds of effects, including tunneling current, electrostatic forces, magnetic forces, chemical bonding, van der Waals forces, and capillary forces. SPMs can detect differences in height that are a fraction of a nanometer, about the diameter of a single atom. A computer combines the data to create an image.

In addition to visualizing nanoscale structures, SPMs are used to manipulate individual atoms and molecules and move them to make specific patterns.

Scanning Probe Microscopy (SPM) has provided a means for several different varieties of atom-scale device fabrication including spin-based logic using Fe atoms on a Cu(111) surface,[4] single-atom transistors using phosphorus dopants in silicon,[5] and binary atomic wires and logic gates using dangling bonds (DBs) on hydrogen-terminated silicon (H—Si).[6] Hydrogen desorption, on the H—Si surface allows creation of DB based circuits for next generation ultimately miniaturized low power nanoelectronic devices beyond complementary metal oxide semiconductor (CMOS) technology.

Hydrogen-terminated silicon surfaces are a promising platform for atomic circuitry and binary data storage on an atomic scale. This is due, among other things, to its inertness, thermal stability, very low defect density, and particularly the unique properties of its surface dangling bonds. Fundamental properties of isolated dangling bonds have been studied extensively. It has been shown that they are electronically isolated from the host substrate and can hold charge, thereby acting as atomic quantum dots. They can be precisely placed and erased, i.e. in a state of 0 or 1. Various functional elements such as quantum-cellular-automaton cells, binary transmission wires, and binary computational gates can be made by arranging dangling bonds close to each other. Dangling bonds on the H—Si surface have been shown to be rewritable[11,12,13] as well as stable at room temperature[14,15] making them an excellent candidate for atom scale devices.

The H—Si surface has found applications in the study of surface chemistry including self-directed growth of ordered multi-molecular lines[16,17] as well as reaction energetics.[18] The controllable desorption of hydrogen from the H—Si (100)-2×1 surface using the probe tip of a scanning tunneling microscope (STM),[19] allowed for more precise studies of surface chemistry[20] as well as fabrication of rudimentary devices.[21,22] With the continued study of DBs on H—Si surfaces, more complex and realizable devices have been developed.

In principle, the capacity of this technology provides smaller, more efficient, faster and cheaper electronics compared to the currently dominant CMOS technology. Despite the progress made in the design of these and other device concepts,[7,8,9,10] practical implementation has been limited due to limitations of existing SPMs and scanners.

Current scanners for SPM tend to experience creep when the scanner is repositioned or moved too quickly during a scanning operation. Creep is a variant of the electric-field-driven ferroelectric poling process. All scanners are poled by applying an electric field while heating the scanner above the Curie temperature. The field is maintained until the scanner material has cooled, thereby locking in a remnant polarization, even at zero applied field. However, actuating a scanner, even well below the Curie temperature, causes some degree of undesired repoling, leading to non-linear behavior known as creep. Creep is most evident, and most troubling, whenever a new scan area is chosen. This is true whether the new area is arrived at by repositioning the fine scanner of the SPM or a new position is chosen through use of the coarse X, Y (inertial) motors of the SPM, or during initial Z approach to the sample with coarse motors and/or a fine scanner.

Upon moving the probe to a new region, creep can cause minutes-long drifting effects that cause scan images to be distorted and successive scans to be of substantially shifted areas, with distortion in Z. For routine scanning, a delay of minutes is typically required to tolerably minimize this asymptotic movement. For the most precise measurements requiring picometer-level accuracy, scanner rest periods on the order of many hours are required before measurements can begin. Creep can also be manifested when large changes occur in the slow scan direction, for instance when restarting scanning of consecutive images. Creep is also evident after approaching the surface with the probe, as the Z range is usually extended to its maximum. This requires substantial time to eliminate the creep in the Z direction.

Closed-loop scanners can correct for creep but they are complex and they require additional real-estate on the scanner assembly. Further, closed-loop scanners are costly and often require reduced scanning speed when the highest level of accuracy is required. Closed-loop scanners can also create lower positioning resolution due to their feedback circuitry and operation. Creep may be greatly reduced by working at 4 K, but for most applications the added cost of cryogenic operation is entirely impractical. For the most demanding cases where there is no option but to work at 4 K, measurement limitations due to creep remain. Creep has come to be accepted as unavoidable in SPM and has limited the accuracy, efficiency, and applicability of this technique.

Creep is also present in coarse positioning with shear piezos in a stick slip mode. That is, in a shear piezo stick slip motion by inertial actuators, creep can occur after the stick slip motion. Creep can also occur in fine positioning of the shear plate motor, which is similar to creep caused by scanning as discussed above. In these situations, a closed loop is required for creep correction and the usual issues with closed loop systems apply (as discussed above). While the amount of creep exhibited in these situations is small compared to the type of motion being measured, creep is still present. However, in the existing literature, the creep effect is mostly ignored (because the piezo actuator (PA) works with high frequency in the piezoelectric inertia-friction actuators (PIFA) systems and the creep effect is small. In operations such as micron scale hysteresis and capacitance position sensor studies, which have low resolution, the effects of creep are ignored. However, creep invariably occurs and, as a matter of scale, cannot be ignored for high resolution applications such as atom scale manufacturing.

Furthermore, piezo actuators exhibit "aging" and are limited in terms of their operating temperature. Aging is related to depoling. Additionally, displacement of some piezoelectric materials (PZT) are frequency dependent, because of creep and hysteresis. Therefore, the displacement of a single step can vary depending on the ramp rate and amplitude of the triangular wave.

Therefore, there exists a need for a system and method for SPM that eliminates creep effects both after fine scanner repositioning and after repositioning using the coarse motors, in all three axes, thereby providing faster and clearer scans in a commercially feasible way. Additionally, there exists a need for piezo actuators that do not exhibit aging as a result to depoling, have limited hysteresis and that are able to withstand high temperature scanning without issue. Creep-free motion is also desirable in other applications requiring high resolution positioning, such as optical lithography, optical mirror positioning, SEM imaging, and sensing.

Furthermore, when utilizing a tube scanner a barrel distortion can be observed in the image because of the bending motion of the tube when scanning XY, which effects the measured Z. In order to alleviate this barrel effect, tube scanners are usually scanned within a small range of the scanner limits.

Therefore, there exists a need to create a nano-positioning system that limits the effect of Z while scanning XY through its limits.

SUMMARY OF THE INVENTION

The present invention provides a nano-positioning system for fine and coarse nano-positioning including at least one actuator, wherein the at least one actuator includes a high Curie temperature material and wherein the nano-positioning system is configured to apply a voltage to the at least one actuator to generate fine and/or coarse motion by the at least one actuator. The nano-positioning system being a stand-alone system, a scanning probe microscope, or an attachment to an existing microscope configured to perform a method of creepless nano-positioning that includes positioning a probe relative to a first area of a substrate using coarse stepping and interacting with the first area of the substrate using fine scanning after less than 60 seconds of the positioning the probe. The movement of the scanning probe microscope is actuated by a high Curie temperature piezoelectric bimorph that is activated with applied voltage. The motion of the scanning probe microscope is quadratic with the applied voltage. Alternatively, the movement of the scanning probe microscope is actuated by a high Curie temperature piezoelectric material that limits and/or eliminates creep, hysteresis and aging. The present invention includes both coarse motion by stick-slip actuation and fine motion with shear piezos. Fine scanning and coarse motion can also be actuated with a bimorph implementation where the piezo bends with the applied voltage in order to impose a directional motion at the non-fixed end of the bimorph. A crawler implementation advances each of three or more directional actuators one at a time in sequence to thereby advance the motor continuously and without mechanical or electrical shock.

BRIEF DESCRIPTION OF THE DRAWINGS

FIG. 5B shows considerable creep, evidenced by the curved appearance of the row features as compared to FIG. 5A;

DESCRIPTION OF THE INVENTION

Definitions

Figure 1:
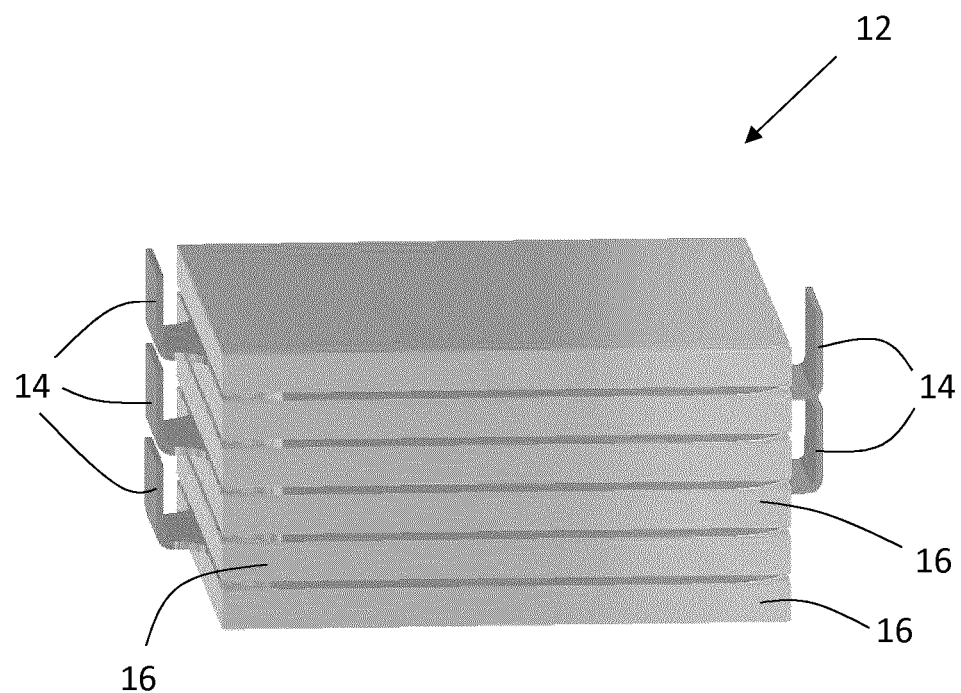
FIG. 1 shows an actuator of a nano-positioning system according to embodiments of the present disclosure, the actuator including a plurality of lithium niobate shear piezoelectric crystals separated by metal plates.

As used herein, "high Curie temperature piezoelectric material" refers to a piezoelectric material having a Curie temperature of over 600° C. Examples of high Curie temperature piezoelectric materials include, but are not limited to, lithium niobate, lithium tantalate ($LiTaO_3$), $PbTiNb_2O_8$, $PbZrNb_2O_8$, and $CaBi_2Nb_2O_9$.

As used herein, the term "fine motion" refers to movement or displacement of a piezoelectric actuator that is in contact with an object, such as a stage, that is stationary relative to the piezoelectric actuator in which the contact point between the piezoelectric actuator and the stationary object is fixed and does not change as the piezoelectric actuator moves.

As used herein, "coarse motion" refers to movement of a piezoelectric actuator that is in contact with an object, such as a stage, that is stationary relative to the piezoelectric actuator in which the contact point between the piezoelectric actuator and the stationary object changes with movement of the piezoelectric actuator, i.e. the contact point is not fixed. Movement of the piezoelectric actuator, relative to the stationary object, occurs in discrete steps and the contact point between the piezoelectric actuator and the stationary object changes as the piezoelectric actuator moves.

As used herein, the term "substantially" refers to the qualitative condition of exhibiting a total or near-total extent or degree of a characteristic or property of interest. For example, being substantially free of a characteristic or property means that the characteristic or property is either entirely absent or it is present to a sufficiently low degree as to have either no impact or only insignificant impact on intended performance or properties.

As used herein, the terms "creepless" and "hysteresis-free" scanning or positioning refers to scanning or positioning that is substantially devoid of creep or hysteresis.

Description

The present invention has utility as a system and method for Scanning Probe Microscopy (SPM) and as a nano-positioning system that substantially eliminates creep effects, and limits hysteresis and aging both after fine scanner repositioning and after repositioning using coarse motors, in all three axes, thereby providing faster and clearer scans in a commercially feasible way. Coarse motor positioning can also become more reproducible, because creep, hysteresis and aging are limited, by providing consistent steps as a function of frequency and voltage, which is not achievable using standard piezo materials.[23]

Crystalline silicon is tetravalent and forms a diamond lattice; each silicon atom shares 4 bonds, two above and two below the atom. At the surface, two of these bonds are unsatisfied so the crystal reorganizes to a lower energy configuration. The addition of atomic hydrogen to the silicon surface during the annealing process results in the formation of one of three possible phases. The likelihood of forming these phases can be controlled by the annealing temperature at which the sample is prepared. The 2×1 phase forms at approximately 300 to 350° C., the 3×1 phase forms at approximately 100 to 150° C., and the 1×1 phase forms below ~20° C.[33,14,34] The most regularly used for DB patterning is the 2×1 phase reconstruction where each surface atom pairs with a neighboring surface atom to create a dimer pair. The dimer pairs form in rows which run parallel to each other across the surface. Each silicon atom at the surface is left with a single unsatisfied bond which extends out into vacuum and can either be terminated with hydrogen or left vacant, creating a dangling bond. Although the preparation of the H—Si(100)-2×1 phase is well understood, it is often difficult to create a perfectly clean, defect free surface. These defects as well as clean H—Si(100) can be imaged using a STM.

Embodiments of the present disclosure provide a nano-positioning system or a scanner for scanning probe microscopy (SPM) applications that substantially eliminates creep effects both after fine scanner repositioning and after repositioning using the coarse motors, in all three axes. The SPM system, the nano-positioning system, and the method of the present disclosure make SPM and positioning much more efficient by eliminating the lag time between changing positions and beginning a scan in a new area without distortion. According to embodiments, the present disclosure provides a method of creepless Scanning Probe Microscopy (SPM) or nano-positioning that includes positioning a probe of a scanning probe microscope relative to a first area of a substrate and scanning the first area of the substrate after less than 60 seconds of positioning the probe. Because the system and method of scanning or positioning of the present disclosure is creepless, scanning, reading, or writing can commence soon after positioning or repositioning of the probe, as compared to the long lag times and repoling times of conventional systems.

Figure 5A:
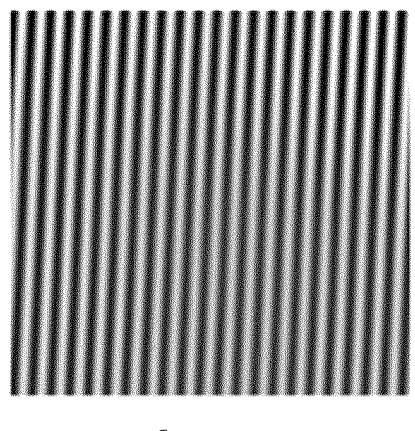
FIGS. 5A and 5B show room temperature scanning tunneling microscope images of a silicon 100 surface using a conventional scanner, with FIG. 5A showing a scan image of the surface at a first position and FIG. 5B showing a scan image of the surface after an 80 nm lateral movement of the scanner.
Figure 5B:
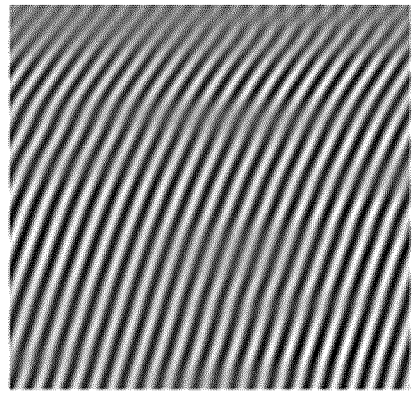

According to embodiments, the system and method of creepless SPM or nano-positioning system further includes SPM recording an image of the scanned of the substrate. In the recorded image, image warpage or distortion, such as that shown in FIG. 5B, is eliminated, and correction algorithms need not be applied during or after data collection.

Embodiments of the present invention are less complex (and therefore more compact), less expensive and less failure-prone than conventional closed loop systems. Moreover, eliminating the closed loop lowers positioning noise and increases scan rates in high speed AFM. According to embodiments of the present disclosure, a scanner/positioner is an attachment that is easily integrated into existing SPM infrastructures as a plug-and-play module, reducing the need for costly development and facilitating wide-spread adoption.

By studying the microscopic changes occurring during the poling process, the system and method of the present disclosure provide for effective elimination of undesired poling during normal scanning to create a near perfect scanner. Embodiments provide an atomic linear scanner or nano-positioner that permits imaging and fabrication with greatly reduced error while also saving time.

Embodiments of the creepless scanning/positioning system include a fine motion scanner and/or an inertial translation device, also known as stick-slip translation device. According to embodiments, the motors and/or other components of the system are formed of high Curie temperature ferroelectric materials, and are thus substantially free of creep and hysteresis. According to certain embodiments, in addition to normal fine motion scanners and stick slip type translation devices, the system also includes a crawler that advances each of three or more directional actuators one at a time in sequence to thereby advance the motor continuously and without mechanical or electrical shock. The crawler is capable of making very fine movements in picometer increments. In contrast to an inertial translation device, also known as stick-slip translation device, the crawler may be considered a continuous motion device or non-stick slip device. According to embodiments, the crawler is also made of a high Curie temperature ferroelectric material. The crawler provides the additional advantage that it moves very smoothly without the shaking, jarring action of a conventional inertial translator, and also without the concomitant large and fast swings in control voltage. Such mechanical and electrical disruptions related to any inertial translator have deleterious noisy effects on sensitive instruments and measurements made with those. The crawler effectively reduces that noise and disruption. In order to move smoothly, continuously, and not in steps, the crawler requires more complex control signals and finer machine tolerances. For example, actuators of the crawler are smoothly retracted in length, thereafter all the actuators are equally and simultaneously extended to achieve sample movement. When fully extended, the process repeats, with each actuator, in sequence, being retracted so as to cause slippage between the actuator and the sample/moving stage it drives in order to reposition the contact point of that actuator. The moving stage that is driven stays stationary because of the greater friction among the other actuators. The process repeats until each actuator obtains a new contact point and allows movement of the moving stage. The sequence of each actuator can be timed to provide smooth motion with no shaking or jarring of a conventional inertial translator.

According to embodiments, the present invention also provides a long range fine scanner that is based upon the bimorph concept. A bimorph is a sandwich-type actuator formed by bonding two layers of piezoelectric materials together, often with a support layer positioned between the two piezoelectric layers. The bimorph causes bending deformations because the two piezoelectric materials are bonded together and one piezo layer produces extension, while the other piezo layer produces contraction, under an electric field from the application of a voltage. The bending movement is at an angle to the elongation/contraction of the piezoelectric material in the bimorph and it is far larger than the linear length change of either piezoelectric material. The motion is nearly quadratic with voltage. According to embodiments, bimorphs of high Curie temperature piezoelectric materials, such as lithium niobate, achieve the desired creep-free motion. According to embodiments, the present invention provides a 2D scanning assembly of two or more high Curie temperature piezoelectric material bimorphs. According to embodiments, a 3D scanning assembly includes a three (or more) bimorph combination that allows scanning in the X, Y, and Z directions. These 2D and 3D scanners have an excellent creep free character. These 2D and 3D scanners also achieve a relatively large scan range as compared to simple linear or shear actuators. According to embodiments, the range is about 100 microns in X and Y, and 1 to 10 times less in Z. In embodiments, the range is up to 250 microns in X and Y.

In embodiments, a ferroelectric material having a far higher Curie temperature than that of normally applied materials, such as lead zirconates, is used, Materials of conventional scanners typically have a Curie temperature of 200 to 350° C. In contrast, a high Curie temperature piezoelectric material utilized in the present invention has a Curie temperature above 600° C. In an embodiment, the high Curie temperature material has a Curie temperature of about 1200° C. The high Curie temperature material may be a ferroelectric material. It will be understood to one having ordinary skill in the art that high Curie temperature piezoelectric materials such as lithium niobate ($LiNbO_3$), lithium tantalate ($LiTaO_3$), $PbTiNb_2O_8$, $PbZrNb_2O_8$, and $CaBi_2Nb_2O_9$ could provide similar creepless behavior.

According to embodiments, the present invention also provides a nano-positioning system 10 configured to provide both fine and coarse positioning (motion). In an embodiment, the nano-positioning system comprises at least one actuator 12, wherein the at least one actuator comprises a high Curie temperature material and wherein the nano-positioning system is configured to apply a voltage to the at least one actuator to generate fine motion by the at least one actuator. In embodiments, the nano-positioning system is further configured to apply a voltage to the at least one actuator to generate coarse motion by the at least one actuator. For example, a shear actuator may be operated in shear mode to provide fine motion or slip stick mode to provide coarse motion. Other actuators that can operate to provide fine motion or coarse motion, depending on how voltage is applied, include bimorph actuators and longitudinal actuators. For example, the rate that the voltage is changes/applied and the shape of the voltage curve (triangular or saw tooth wave for example) can vary, which then can change the mode of operation from coarse to fine.

Figure 2:
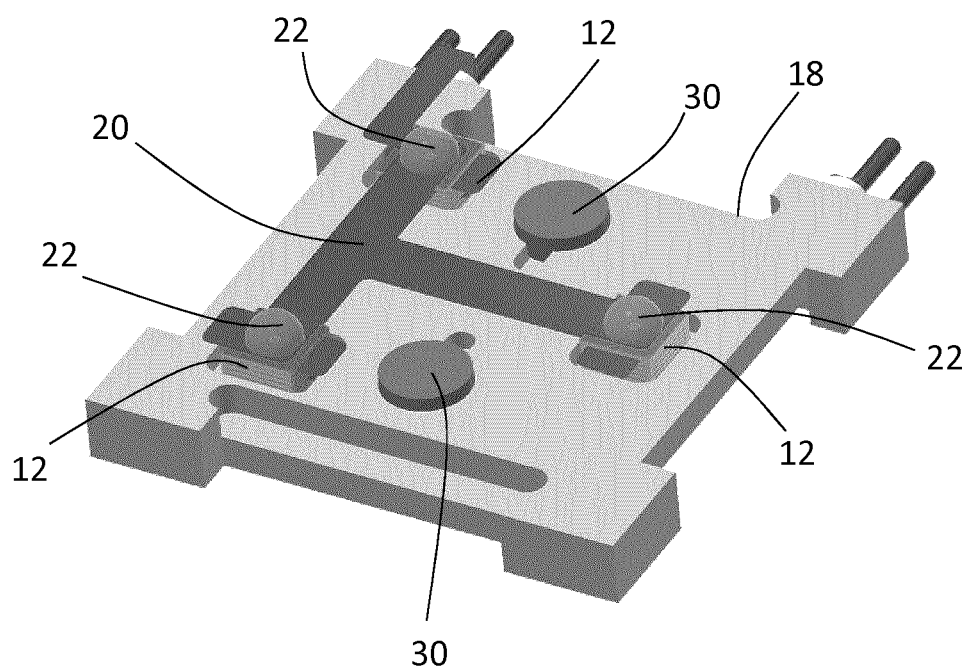
FIG. 2 shows a stationary stage of a nano-positioning system according to embodiments of the present disclosure, the stationary stage having three actuators connected by one electrode to apply voltage and ceramic balls positioned on the electrode to ride in the v-groove and plate of the moving stage of FIG. 3, the stationary stage also having two disc magnets recessed therein to magnetically hold the moving stage of FIG. 3 to the stationary stage.
Figure 3:
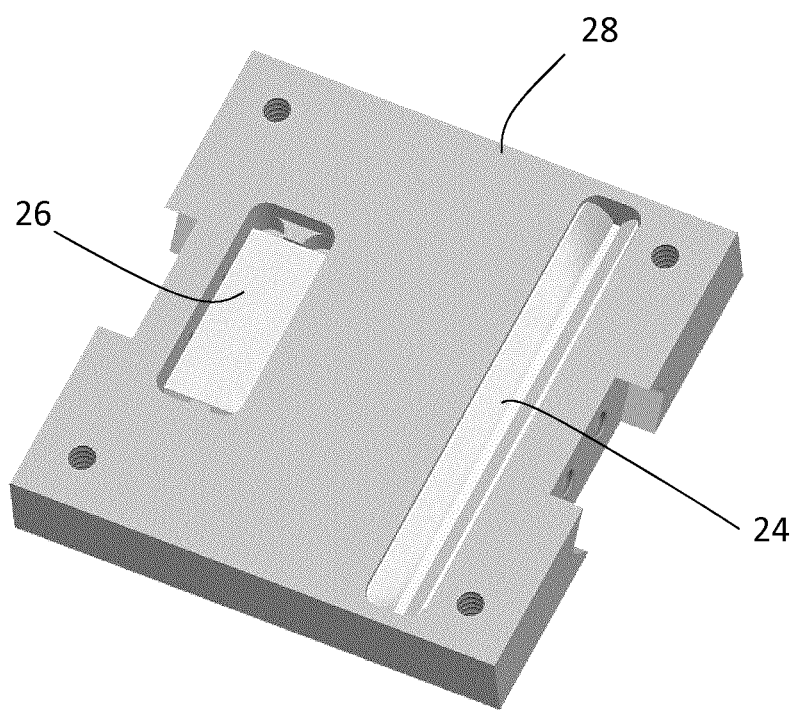
FIG. 3 shows a moving stage of a nano-positioning system according to embodiments of the present disclosure, the moving stage having a V-groove and flat plate that the three ceramic balls of FIG. 2 ride in, allowing for motion in one axis.
Figure 4:
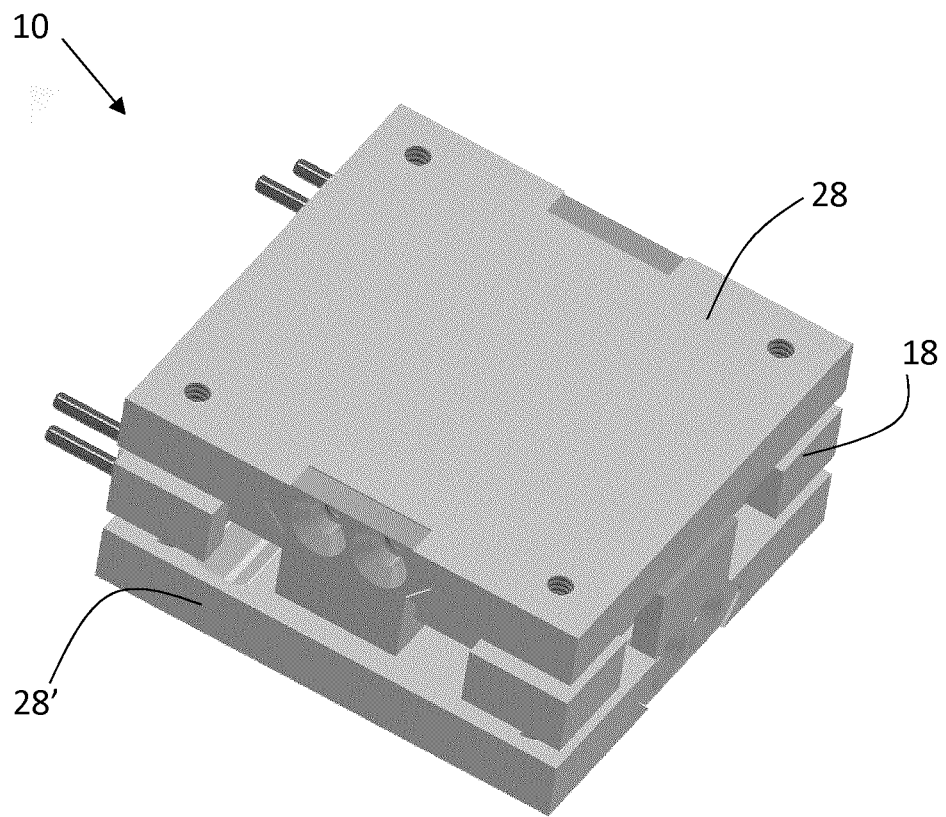
FIG. 4 shows a perspective view of an assembled mover of a nano-positioning system according to embodiments of the present disclosure.

FIG. 1 shows an actuator 12 of a nano-positioning system 10 according to embodiments of the present disclosure, the actuator 12 including a plurality of lithium niobate shear piezoelectric crystals 14 separated by metal plates 16. FIG. 2 shows a stationary stage 18 of a nano-positioning system 10, the stationary stage having three actuators 12 connected by one electrode 20 to apply voltage and ceramic balls 22 positioned on the electrode 20 to ride in the V-groove 24 and plate 26 of the moving stage 28 of FIG. 3. The stationary stage 18 also has two disc magnets 30 recessed therein to magnetically hold the moving stage 28 of FIG. 3 to the stationary stage 18. The moving stage 28 is shown in FIG. 3, the moving stage 28 has a V-groove 24 and flat plate 26 that the three ceramic balls 22 of FIG. 2 ride in, allowing for motion in one axis, for example the x-axis. FIG. 4 shows a perspective view of an assembled two axis mover of a nano-positioning system 10. In the assembled mover of FIG. 4, the x-axis actuators are placed on the side of the stationary (middle) stage 18 and the y-axis actuators are placed on the other side of the stationary (middle) stage 18. The top and bottom stages are the two moving stages 28, 28'. Since the very bottom stage 28' of the mover is bolted to a stationary object, the middle stage 18 and top stage 28 become the x and y motion of the mover.

In other embodiments, the nano-positioning system comprises at least one actuator for fine motion, as described above, and at least one second actuator for coarse motion, wherein the at least one second actuator comprises a high Curie temperature material and the nano-positioning system is configured to apply a voltage to the at least one second actuator to generate coarse stepping by the at least one second actuator. In embodiments, the at least one actuator is a bimorph actuator, a shear actuator, or a longitudinal actuator. In embodiments, the at least one second actuator is a bimorph, shear or longitudinal actuator. The basic design and operation of these types of actuators is understood to one of ordinary skill in the art. The nano-positioning system may include a single actuator that is capable of fine motion, or both fine and coarse motion, or the nano-positioning device may include a plurality of actuators that are capable of fine motion or both fine and coarse motion. For example, the nano-positioning system may include 2, 3, 4, 5, 6, 7, 8, 9, 10, 15, 20, or more actuators that are capable of fine motion or both fine and coarse motion. Similarly, in addition to the actuator(s) that is/are capable of fine or both fine and coarse motion, the nano-positioning device may include a single actuator that is capable of coarse motion, or it may include a plurality of actuators that are capable of coarse motion. For example, the nano-positioning device may comprise 2, 3, 4, 5, 6, 7, 8, 9, 10, 15, 20, or more actuators that are capable of coarse motion. Actuators that are capable of coarse motion are referred to herein as coarse motors. The number of actuators may be selected by a person skilled in the art depending on the desired axes of movement and the mechanical design of the nano-positioning system. In an embodiment, a nano-positioning device for scanning probe microscopy comprises three actuators mounted to a stationary stage per axis. Each actuator is a stack of thin shear lithium niobate piezoelectric crystals separated by a metal plate to apply voltage to each face of the crystal. Alternating voltages across the metal plates make it possible to apply a field across the crystal to create a shearing action. The crystal requires the correct crystallographic orientation to produce a shearing action with applied voltage field and this is a function of how the crystal is cut from the bulk single crystal of lithium niobate. On top of each actuator is a ceramic ball that rides in a v-groove for two actuators and on a flat plate for the third actuator. The v-groove and plate are mounted into the movable stage. This allows motion in one axis. A quick drop (10 ns) of the applied field to all 3 actuators will cause the movable stage to slip a small amount (nm's to µm's) with respect to all 3 actuators and constitutes one coarse step. If the field on the 3 actuators is varied slowly (microseconds) the ceramic balls will retain their place in the v-groove and plate and the movable stage can be scanned back and forth in direct proportion to the field. This constitutes fine motion. Another set of actuators is mounted to the back side of the stationary stage and acts on a v-groove and plate mounted on a movable stage at right angles to the first set. This causes motion orthogonal to the first set when actuating the second set of 3 actuators. This can be understood as x and y motion.

Nano-positioning systems of the present disclosure may find application outside the field of scanning probe microscopy, where the fine and coarse nano-positioning with little-to-no creep or hysteresis is desired. For example, positioning stages for SEM, TEM, alignment stages for semiconductor lithography and for fine mirror and optical stage motion.

The following example is a specific non-limiting example of the present invention. Specific details provided in the example should not be considered to place a limit on the scope of the appended claims.

Example

Figure 5C:
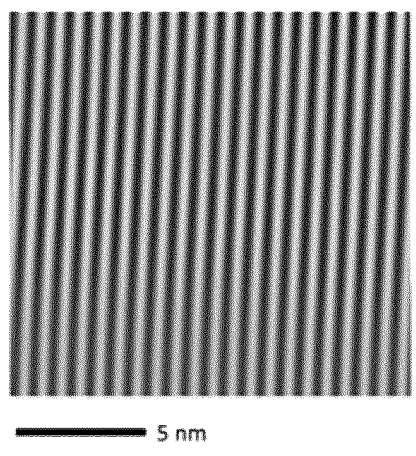
FIGS. 5C and 5D show room temperature scanning tunneling microscope images of a silicon 100 surface using a scanner according to embodiments of the present disclosure, with FIG. 5C showing a scan image of the surface at a first position and FIG. 5D showing a scan image of the surface after an 80 nm lateral movement of the scanner, in FIG. 5D the rows appear straight, not curved, and moreover, the slope of the rows is the same in FIG. 5C taken before repositioning.

A room temperature scanning tunneling microscope is equipped with both a conventional scanner and a scanner according to embodiments of the present disclosure to measure and compare the creep rates for each type of scanner. A silicon (100) sample is used for the comparative scans. Naturally occurring rows on the silicon (100) surface provide a convenient guide to the eye. The rows should appear as straight lines. After leaving the tip stationary for a time long enough to eliminate detectable creep motion, images are recorded using the conventional scanner and the scanner of the present disclosure. The image generated by the conventional scanner is shown in FIG. 5A and the image generated using the scanner of the present disclosure is shown in FIG. 5C.

Figure 5D:
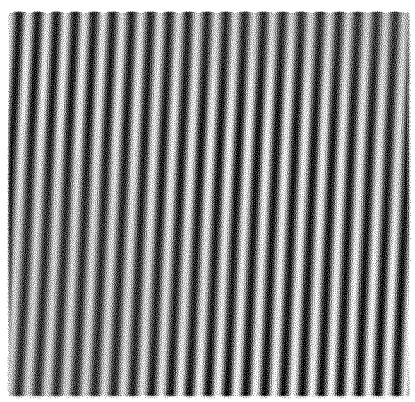

The tip is then repositioned laterally by 80 nm and a new scan is immediately initiated. The move and start of a new scan are done under program control to eliminate operator related variations in timing. FIG. 5B shows the image recorded by the conventional scanner after repositioning. FIG. 5D shows the image recorded by the scanner of the present disclosure after repositioning. As shown in FIG. 5B, the image recorded by the conventional scanner after repositioning includes distortion or curvature in the images due to creep. Moreover, a comparison of the images recorded by the conventional scanner before repositioning (FIG. 5A) and after repositioning (FIG. 5B) shows differences in slope of the rows, which indicates that creep has not yet fully decayed. As shown in FIG. 5D, the rows of the scan image recorded with the scanner of the present disclosure after repositioning appear straight, not curved, and moreover, the slope of the rows is the same in the images taken before and after repositioning. The images were collected on the order of 1 to 30 minutes.

In this example, the STM images were Fourier filtered to remove atom-scale features and thereby emphasize the row structures and the distortion of those due to creep.

Figure 6:
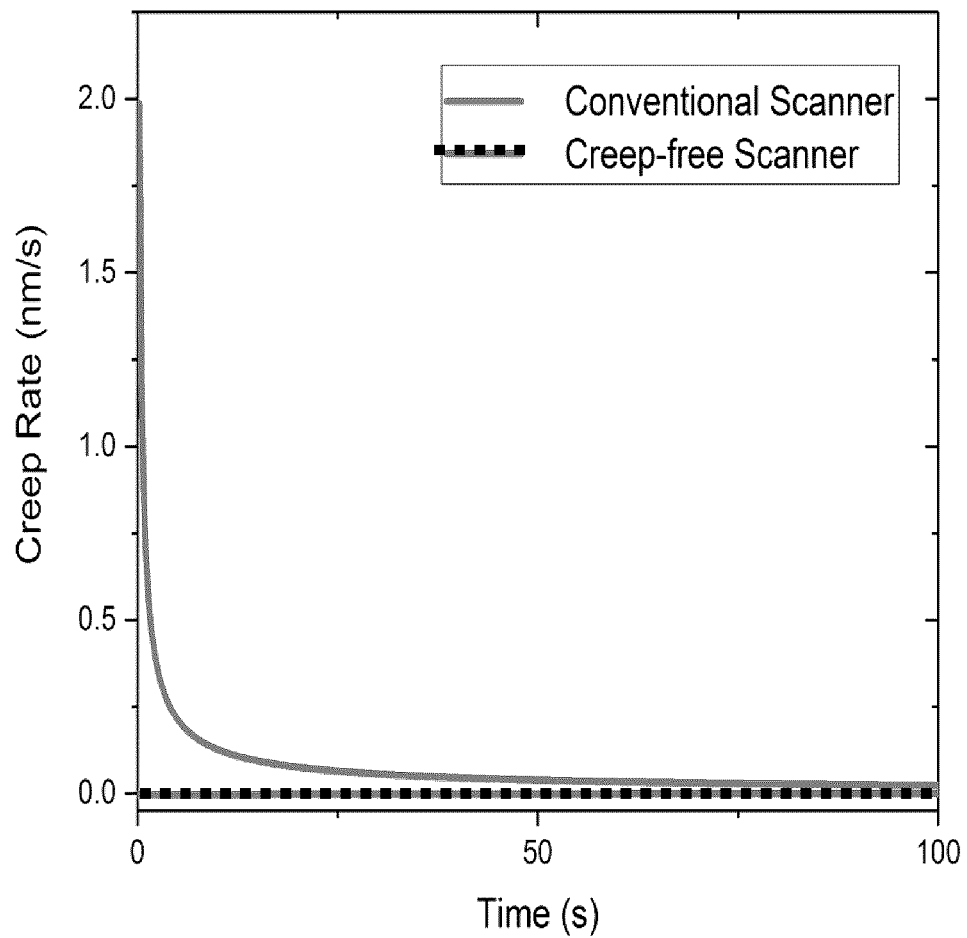
FIG. 6 shows a graph of creep rate versus time for a conventional scanner (the curved line) and a creep-free scanner according to embodiments of the present disclosure (the straight line), with the line of the conventional scanner showing that the conventional scanner continues to move (creep) despite the control signal being constant, resulting in the severe warpage of the scan image of FIG. 5B acquired after repositioning of the probe and a undesired shifting of the scanned area as scanning proceeds, while the line of the creep-free scanner according to embodiments of the present disclosure shows that the probe moves as directed and does not creep allowing images to be recorded immediately after probe repositioning, promptly yielding accurate, useful scans as shown in FIG. 5D.

As shown in FIG. 6, the conventional scanner (the curved line of FIG. 6) continues to move (creep) despite the control signal being constant, resulting in the severe warpage of the scan image of FIG. 5B acquired after repositioning of the probe and an undesired shifting of the scanned area as scanning proceeds. FIG. 6 demonstrates that more than 100 seconds elapse before the rate of creep of the conventional scanner becomes negligible. In contrast, the scanner of the present disclosure (lower line in FIG. 6) immediately locks into its new position, moves as directed, and does not creep, allowing images to be recorded immediately after probe repositioning, promptly yielding accurate, useful scans as shown in FIG. 5D.

References and patent documents cited herein are incorporated by reference to the same extent as if each reference was individually and explicitly incorporated by reference.

As a person skilled in the art will recognize from the previous detailed description and from the figures and claims, modifications and changes can be made to the preferred embodiments of the invention without departing from the scope of this invention defined in the following claims.

REFERENCES

[1] Floris A. Zwanenburg, Andrew S. Dzurak, Andrea Morello, Michelle Y. Simmons, Lloyd C L Hollenberg, Gerhard Klimeck, Sven Rogge, Susan N. Coppersmith, and Mark A. Eriksson. Silicon quantum electronics. Reviews of Modern Physics, 85(3):961-1019, 2013.

[2] Dieter K. Schroder. Semiconductor Material and Device Characterization. John Wiley & Sons, Inc., Hoboken, NJ, USA, October 2005.

[3] Enrico Prati and Takahiro Shinada. Atomic scale devices: Advancements and directions. Technical Digest—International Electron Devices Meeting, IEDM, 2015 (February):1.2.1-1.2.4, 2015.

[4] Alexander Ako Khajetoorians, Jens Wiebe, Bruno Chilian, and Roland Wiesendanger. Realizing All-Spin-Based Logic Operations Atom by Atom. Science, 332(6033): 1062-1064, May 2011.

[5] Martin Fuechsle, Jill A. Miwa, Suddhasatta Mahapatra, Hoon Ryu, Sunhee Lee, Oliver Warschkow, Lloyd C. L. Hollenberg, Gerhard Klimeck, and Michelle Y. Simmons. A single atom transistor. Nature Nanotechnology, 7(4): 242-246, 2012.

[6] Taleana R. Huff, Hatem Labidi, Mohammad Rashidi, Mohammad Koleini, Roshan Achal, Mark H. Salomons, and Robert A. Wolkow. Atomic White-Out: Enabling Atomic Circuitry through Mechanically Induced Bonding of Single Hydrogen Atoms to a Silicon Surface. ACS Nano, 11:8636-8642, 2017.

[7] F. E. Kal, M. P. Rebergen, E. Fahrenfort, J. Girovsky, R. Toskovic, J. L. Lado, J. Fernandez-Rossier, and A. F. Otte. A kilobyte rewritable atomic memory. Nature Nanotechnology, 11(11):926-929, November 2016.

[8] A. Imre, G. Csaba, L. Ji, G. Orlov, G. H. Bernstein, and W. Porod. Majority Logic Gate for Magnetic Quantum-Dot Cellular Automata. Science, 331(5758):205-208, June 2006.

[9] Kai Sotthewes, Victor Geskin, Rene Heimbuch, Avijit Kumar, and Harold J W Zandvliet. Research Update: Molecular electronics: The single-molecule switch and transistor. APL Materials, 2(010701), 2014.

[10] Niko Pavlicek, Zsolt Majzik, Gerhard Meyer, and Leo Gross. Passivation of dangling bonds on hydrogenated Si(100)-2×1: a possible method for error correction in hydrogen lithography. arXiv e-prints, arXiv: 1706.02560v2, 9 Jun. 2017.

[11] Roshan Achal, Mohammad Rashidi, Jeremiah Croshaw, David Churchill, Marco Taucer, Taleana Huff, Martin Cloutier, Jason Pitters, and Robert A. Wolkow. Lithography for robust and editable atomic-scale silicon devices and memories. Nature Communications, 9(1):2778, December 2018.

[12] M. Baseer Haider, Jason L. Pitters, Gino A. DiLabio, Lucian Livadaru, Josh Y. Mutus, and Robert A. Wolkow. Controlled Coupling and Occupation of Silicon Atomic Quantum Dots at Room Temperature. Physical Review Letters, 102(4):046805, January 2009.

[13] G. P. Lopinski, D. D. M. Wayner, and R. A. Wolkow. Self-directed growth of molecular nanostructures on silicon. Nature, 406(6791):48-51, July 2000.

[14] Xiao Tong, Gino A Dilabio, and Robert A Wolkow. A Self-Directed Growth Process for Creating Covalently Bonded Molecular Assemblies on the HSi(100)-3×1 Surface. Nano Letters, 4(5):979-983, 2004.

[15] Alexander B Sieval, Ricarda Opitz, Huub P A Maas, Michael G Schoeman, Geert Meijer, Frank J Vergeldt, Han Zuilhof, and Ernst J R Sudholter. Monolayers of 1-Alkynes on the H-Terminated Si(100) Surface. Langmuir, 16(26):10359-10368, 2000.

[16] J. W. Lynding, T-C. Shen, G. C. Abelin, C. Wang, and J. R. Tucker. Nanoscale patterning and selective chemistry of silicon surfaces by ultrahigh-vacuum scanning tunneling microscopy. Nanotechnology, 7(2):128-133, 1996.

[17] S R Schofield, N J Curson, M Y Simmons, F J Rue, T Hallam, L Oberbeck, and R G Clark. Atomically Precise Placement of Single Dopants in Si. Physical Review Letters, 91(13):136104, 2003.

[18] Robert. Wolkow. A Step Toward Making and Wiring Up Molecular-Scale Devices. Japanese Journal of Applied Physics, 40:4378-4380, Part 1, No. 6B, June 2001.

[19] J. R. Tucker and T.-C. Shen. Prospects for Atomically Ordered Device Structures Based of STM Lithography. Solid State Electronics, 42(7-8):1061-1067, 1998.

[20] J. N. Randall, J. R. Von Ehr, J. B. Ballard, J. H. G. Owen, and E. Fuchs. Automated Scanning Tunneling Microscope image analysis of Si (100):H 2×1 surfaces. Microelectronic Engineering, 98:214-217, 2012.

[21] Mohammad Hadi Modarres, Rossella Aversa, Stefano Cozzini, Regina Ciancio, Angelo Leto, and Giuseppe Piero Brandino. Neural Network for Nanoscience Scanning Electron Microscope Image Recognition. Scientic Reports, 7(1):13282, December 2017.

[22] Maxim Ziatdinov, Artem Maksov, and Sergei V. Kalinin. Learning surface molecular structures via machine vision. npj Computational Materials, 3(1):31, December 2017.

[23] M. N. Islam, and R. J. Seethaler. Note: Position self-sensing for piezoelectric actuators in the presence of creep and rate dependent hysteresis. Rev. Sci. Instrum. 83(11), 116101 (2012).

The invention claimed is:

1. A nano-positioning system for fine and coarse nano-positioning, the nano-positioning system comprising at least one actuator, wherein the at least one actuator comprises a high Curie temperature material having a Curie temperature above 550° C., and wherein the nano-positioning system is configured to apply a voltage to the at least one actuator to generate coarse motion by the at least one actuator.

2. The nano-positioning system of claim 1, wherein the nano-positioning system is further configured to apply a voltage to the least one actuator to generate fine motion by the at least one actuator.

3. The nano-positioning system of claim 2, wherein the at least one actuator is a shear actuator, a longitudinal actuator, or a bimorph actuator.

4. The nano-positioning system of claim 1, further comprising at least one second actuator, wherein the at least one second actuator comprises a high Curie temperature material having a Curie temperature above 550° C., and the nano-positioning system is further configured to apply a voltage to the at least one second actuator to generate fine motion by the at least one second actuator.

5. The nano-positioning system of claim 4, wherein the nano-positioning system is further configured to apply a voltage to the least one second actuator to generate coarse motion by the at least one second actuator.

6. The nano-positioning system of claim 5, wherein the at least one second actuator is a bimorph actuator, a longitudinal actuator, or a shear actuator.

7. The nano-positioning system of claim 4, wherein the at least one actuator is a bimorph actuator or a shear actuator, and the at least one second actuator is a shear actuator or components of a crawler.

8. The nano-positioning system of claim 4, further comprising a probe, wherein the at least one actuator alone or in combination with the at least one second actuator is configured to controllably position the probe.

9. The nano-positioning system of claim 1, wherein the high Curie temperature material is a ferroelectric material.

10. The nano-positioning system of claim 1, wherein the high Curie temperature material provides motion that is substantially consistent and substantially hysteresis and creep-free as a function of applied voltage frequency and amplitude.

11. The nano-positioning system of claim 1, wherein the high Curie temperature material provides Z motion that is decoupled from XY motion.

12. A method of nano-positioning comprising:
   positioning a probe relative to a first area of a substrate using coarse motion; and
      reading, writing, or scanning the first area of the substrate using fine motion after less than 60 seconds of the positioning the probe,
      wherein the course and/or the fine motion of the probe is actuated by at least one actuator comprising a high Curie temperature material having a Curie temperature above 550° C., and
      wherein the movement of the high Curie temperature material is activated with an applied voltage.

13. The method of claim 12, wherein the probe is a probe of a scanning probe microscope.

14. The method of claim 13, further comprising recording a Scanning Probe Microscopy (SPM) image of the first area of the substrate, wherein the SPM image is substantially free of distortion.

15. The method of claim 12, wherein the probe is positioned using fine scanner repositioning techniques or coarse stepping is carried out using a coarse motor of the scanning probe microscope.

16. The method of claim 12, wherein the at least one actuator is a shear actuator, a longitudinal actuator, or a bimorph actuator.

17. An attachment to an existing scanning probe microscope, the attachment enabling the existing scanning probe microscope to perform the method of claim 12.

18. The method of claim 12, wherein the high Curie temperature material comprises lithium niobate or lithium tantalate.

19. The method of claim 12, wherein both the coarse and fine motion of the probe are actuated by the at least one actuator.

20. A nano-positioning system comprising at least one actuator, wherein the at least one actuator comprises lithium niobate, lithium tantalate, $PbTiNb_2O_8$, $PbZrNb_2O_8$, or $CaBi_2Nb_2O_9$; and wherein the nano-positioning system is configured to apply a voltage to the at least one actuator to generate coarse motion by the at least one actuator.

21. The nano-positioning system of claim 1, wherein the high Curie temperature material comprises lithium niobate or lithium tantalate.

* * * * *